(12) United States Patent
Li et al.

(10) Patent No.: US 10,560,054 B2
(45) Date of Patent: Feb. 11, 2020

(54) CIRCUIT SYSTEM

(71) Applicant: HUAWEI TECHNOLOGIES CO., LTD., Shenzhen (CN)

(72) Inventors: Ding Li, Shenzhen (CN); Shuai Du, Chengdu (CN); Yixing Chu, Chengdu (CN)

(73) Assignee: HUAWEI TECHNOLOGIES CO., LTD., Shenzhen (CN)

( * ) Notice: Subject to any disclaimer, the term of this patent is extended or adjusted under 35 U.S.C. 154(b) by 0 days.

(21) Appl. No.: 15/907,302

(22) Filed: Feb. 28, 2018

(65) Prior Publication Data

US 2018/0248520 A1    Aug. 30, 2018

(30) Foreign Application Priority Data

Feb. 28, 2017    (CN) .......................... 2017 1 0116542

(51) Int. Cl.
*H03F 3/68* (2006.01)
*H03F 1/02* (2006.01)
(Continued)

(52) U.S. Cl.
CPC ............ *H03F 1/02* (2013.01); *H03F 1/3211* (2013.01); *H03F 3/45* (2013.01); *H03F 3/45475* (2013.01);
(Continued)

(58) Field of Classification Search
CPC ................. H03F 1/34; H03F 3/45; H03F 3/68
(Continued)

(56) References Cited

U.S. PATENT DOCUMENTS 6,201,442 B1 * 3/2001 James .................... H03F 1/083
330/107

7,002,409 B1 * 2/2006 Aram ..................... H03F 1/08
330/103

2010/0214024 A1    8/2010 Jones et al.
2018/0234056 A1    8/2018 Sun et al.

FOREIGN PATENT DOCUMENTS

CN    105932971 A    9/2010
CN    106026937 A    10/2016
(Continued)

OTHER PUBLICATIONS

Fan You et al: "Multistage Amplifier Topologies with Nested-Compensation", IEEE Journal of Solid-State Circuit. IEEE Service Center, Piscataway, NJ, USA, vol. 32, No. 12, Dec. 1, 1997, XP011060638, 12 pages.
(Continued)

*Primary Examiner* — Steven J Mottola
(74) *Attorney, Agent, or Firm* — Kilpatrick Townsend & Stockton LLP (57) ABSTRACT

A circuit system including an operational amplification circuit is disclosed. The operational amplification circuit includes N stages of operational amplification units that are cascaded, an input terminal of the $1^{st}$ stage of operational amplification unit is an input terminal of the operational amplification circuit, and an output terminal of the $N^{th}$ stage of operational amplification unit is an output terminal of the operational amplification circuit; an output terminal of the $i^{th}$ stage of operational amplification unit is connected to an input terminal of the $(i+1)^{th}$ stage of operational amplification unit, so as to provide an input signal for the $(i+1)^{th}$ stage of operational amplification unit; and there is a feedback channel from the output terminal of the $N^{th}$ stage of operational amplification unit to an input terminal of each of the $1^{st}$ stage of operational amplification unit to the $N^{th}$ stage of operational amplification unit.

11 Claims, 8 Drawing Sheets

(51) Int. Cl.
*H03F 3/45* (2006.01)
*H03F 1/32* (2006.01)
(52) U.S. Cl.
CPC .. *H03F 2200/129* (2013.01); *H03F 2200/135* (2013.01); *H03F 2200/144* (2013.01); *H03F 2200/405* (2013.01); *H03F 2200/408* (2013.01); *H03F 2200/411* (2013.01); *H03F 2203/45114* (2013.01); *H03F 2203/45116* (2013.01); *H03F 2203/45224* (2013.01); *H03F 2203/45512* (2013.01); *H03F 2203/45526* (2013.01); *H03F 2203/45528* (2013.01); *H03F 2203/45594* (2013.01)

(58) Field of Classification Search
USPC ................................ 330/69, 98, 99, 100, 85
See application file for complete search history.

(56) References Cited

FOREIGN PATENT DOCUMENTS

EP    2849340 A1    3/2015
EP    2937996 A2    10/2015

OTHER PUBLICATIONS

Mortaza Mojarad et al: "A novel frequency compensation scheme for on-chip low-dropout voltage regualtors", Electronics, Circuits and Systems (ICECS), 2011 18th IEEE International Conference on, IEEE, Dec. 11, 2011, XP032095046, 4 pages.

* cited by examiner

<Prior Art>

FIG. 3

<Prior Art>

FIG. 4

<Prior Art>

CIRCUIT SYSTEM

CROSS-REFERENCE TO RELATED APPLICATION

This application claims priority to Chinese Patent Application No. 201710116542.9, filed on Feb. 28, 2017, which is hereby incorporated by reference in its entirety.

TECHNICAL FIELD

This application relates to the field of circuit technologies, and more specifically, to a circuit system.

BACKGROUND

An operational amplifier is a basic element in an analog circuit system and a hybrid signal system, and is generally used for an operation, driving, and the like. Currently, an output of the operational amplifier has non-ideal features, including a noise, a distortion, an offset, and the like. Consequently, quality of an output signal is severely affected, thereby affecting system performance. Particularly, when a system needs to output high power or drive a heavy load, that is, when the system needs to output with relatively high power or relatively high amplitude, specifically, for example, when the system is applied to an environment such as a headphone, an earphone, and a line driver, the non-ideal features such as the distortion and the noise of the output of the operational amplifier are obviously worse, and performance of the operational amplifier is severely affected.

A common operational amplification circuit used for driving a load usually uses a structure in which multiple stages of operational amplifiers are cascaded. In this cascading structure, non-ideal features of a signal increase stage by stage, and are accumulated at an output stage. When the operational amplification circuit drives a heavy load (that is, when an equivalent impedance of the load is low, and power output by the operational amplification circuit is high), the non-ideal features of the operational amplification circuit are severer. Therefore, a circuit system having a structure that can suppress the non-ideal features of the operational amplifier urgently needs to be designed.

SUMMARY

This application provides a circuit system, so that non-ideal features of an operational amplification circuit can be suppressed, and performance of a circuit system can be improved.

According to a first aspect, a circuit system is provided, including an operational amplification circuit. The operational amplification circuit includes N stages of operational amplification units that are cascaded, each stage of operational amplification unit includes an input terminal and an output terminal, the input terminal of the $1^{st}$ stage of operational amplification unit is an input terminal of the operational amplification circuit and is configured to receive an initial input signal, the output terminal of the $N^{th}$ stage of operational amplification unit is an output terminal of the operational amplification circuit, and N is greater than or equal to 2; the output terminal of the $i^{th}$ stage of operational amplification unit is connected to the input terminal of the $(i+1)^{th}$ stage of operational amplification unit, so as to provide an input signal for the $(i+1)^{th}$ stage of operational amplification unit, where i is 1, 2, . . . , or N−1; and there is a feedback channel from the output terminal of the $N^{th}$ stage of operational amplification unit to the input terminal of each of the $1^{st}$ stage of operational amplification unit to the $N^{th}$ stage of operational amplification unit, so as to transmit an output signal of the $N^{th}$ stage of operational amplification unit to the input terminal of each stage of operational amplification unit.

In the circuit system in this application, the feedback channel is added to the operational amplification circuit, so that a loop gain of the operational amplification circuit can be increased, and non-ideal features of the operational amplification circuit can be suppressed when the operational amplification circuit drives the load circuit, thereby improving performance of the circuit system.

In a possible implementation, the circuit system further includes a load circuit, and the output terminal of the operational amplification circuit is connected to the load circuit, so as to drive the load circuit.

In a possible implementation, there is a feedback channel from the output terminal of the $j^{th}$ operational amplification unit to the input terminal of each of the $1^{st}$ stage of operational amplification unit to the $j^{th}$ operational amplification unit, and j is any value from 1 to N−1.

In a possible implementation, there is a feedforward channel from the input terminal of the $1^{st}$ stage of operational amplification unit to the input terminal of each of the N stages of operational amplification units.

In a possible implementation, there is a feedforward channel from the output terminal of the $j^{th}$ operational amplification unit to the input terminal of each stage of operational amplification unit following the $j^{th}$ operational amplification unit, and j is any value from 1 to N−1.

In a possible implementation, the feedforward channel and the feedback channel each include at least one of a resistor, a capacitor, a transistor, or an electron tube.

In a possible implementation, the $k^{th}$ stage of operational amplification unit includes an operational amplifier with a first input terminal, a second input terminal, a first output terminal, and a second output terminal, and a first capacitor and a second capacitor that have an equal capacity, and k is any value from 1 to N, where the first input terminal of the operational amplifier in the $k^{th}$ stage of operational amplification unit is connected to the first output terminal of the operational amplifier in the $k^{th}$ stage of operational amplification unit by using the first capacitor, and the second input terminal of the operational amplifier in the $k^{th}$ stage of operational amplification unit is connected to the second output terminal of the operational amplifier in the $k^{th}$ stage of operational amplification unit by using the second capacitor; a first input terminal and a second input terminal of an operational amplifier in the $1^{st}$ stage of operational amplification unit are configured to receive the initial input signal; and the $s^{th}$ stage of operational amplification unit further includes a first resistor and a second resistor that have an equal resistance value, a first input terminal of an operational amplifier in the $s^{th}$ stage of operational amplification unit is connected to a first output terminal of an operational amplifier in the $(s−1)^{th}$ stage of operational amplification unit by using the first resistor, a second input terminal of the operational amplifier in the $s^{th}$ stage of operational amplification unit is connected to a second output terminal of the operational amplifier in the $(s−1)^{th}$ stage of operational amplification unit by using the second resistor, and s is any value from 2 to N. In this possible implementation, a circuit system including a dual-input and dual-output operational amplification circuit is implemented.

In a possible implementation, the $k^{th}$ stage of operational amplification unit includes the operational amplifier with the first input terminal, the second input terminal, the first output terminal, and the second output terminal, and a third resistor and a fourth resistor that have an equal resistance value, and k is any value from 1 to N, where a first output terminal of an operational amplifier in the $N^{th}$ stage of operational amplification unit is connected to the first input terminal of the operational amplifier in the $k^{th}$ stage of operational amplification unit by using the third resistor, and a second output terminal of the operational amplifier in the $N^{th}$ stage of operational amplification unit is connected to the second input terminal of the operational amplifier in the $k^{th}$ stage of operational amplification unit by using the fourth resistor; and the third resistor in the $k^{th}$ stage of operational amplification unit, the fourth resistor in the $k^{th}$ stage of operational amplification unit, the first output terminal of the operational amplifier in the $N^{th}$ stage of operational amplification unit, the first input terminal of the operational amplifier in the $k^{th}$ stage of operational amplification unit, the second output terminal of the operational amplifier in the $N^{th}$ stage of operational amplification unit, and the second input terminal of the operational amplifier in the $k^{th}$ stage of operational amplification unit form the feedback channel. In this possible implementation, a feedback channel of a dual-input and dual-output operational amplification circuit is implemented.

In another possible implementation, the $k^{th}$ stage of operational amplification unit includes an operational amplifier with a first input terminal, a second input terminal, and a first output terminal, and a first capacitor and a second capacitor that have an equal capacity, and k is any value from 1 to N; and an operational amplifier in the $j^{th}$ stage of operational amplification unit further includes a second output terminal, and j is any value from 1 to N−1, where a first input terminal of the operational amplifier in the $j^{th}$ stage of operational amplification unit is connected to a first output terminal of operational amplifier in the $j^{th}$ stage of operational amplification unit by using the first capacitor, and a second input terminal of the operational amplifier in the $j^{th}$ stage of operational amplification unit is connected to the second output terminal of operational amplifier in the $j^{th}$ stage of operational amplification unit by using the second capacitor; the $N^{th}$ stage of operational amplification unit further includes a phase inverter, the phase inverter is connected in series to the second capacitor, a first input terminal of an operational amplifier in the $N^{th}$ stage of operational amplification unit is connected to a first output terminal of the operational amplifier in the $N^{th}$ stage of operational amplification unit by using the first capacitor, and a second input terminal of operational amplifier in the $N^{th}$ stage of operational amplification unit is connected to the first output terminal of the operational amplifier in $N^{th}$ stage of operational amplification unit by using the phase inverter and the second capacitor that are connected in series; a first input terminal and a second input terminal of an operational amplifier in the $1^{st}$ stage of operational amplification unit are configured to receive the initial input signal; and the $s^{th}$ stage of operational amplification unit further includes a first resistor and a second resistor that have an equal resistance value, a first input terminal of an operational amplifier in the $s^{th}$ stage of operational amplification unit is connected to a first output terminal of an operational amplifier in the $(s-1)^{th}$ stage of operational amplification unit by using the first resistor, a second input terminal of the operational amplifier in the $s^{th}$ stage of operational amplification unit is connected to a second output terminal of the operational amplifier in the $(s-1)^{th}$ stage of operational amplification unit by using the second resistor, and s is any value from 2 to N. In this possible implementation, a circuit system including a dual-input and single-output operational amplification circuit is implemented.

In a possible implementation, the $k^{th}$ stage of operational amplification unit includes the operational amplifier with the first input terminal, the second input terminal, and the first output terminal, and a third resistor and a fourth resistor that have an equal resistance value, and k is any value from 1 to N; and the operational amplifier in the $j^{th}$ stage of operational amplification unit further includes the second output terminal, and j is any value from 1 to N−1, where the $N^{th}$ stage of operational amplification unit further includes the phase inverter, the first output terminal of the operational amplifier in the $N^{th}$ stage of operational amplification unit is connected to the first input terminal of the operational amplifier in the $k^{th}$ stage of operational amplification unit by using the third resistor, and the first output terminal of the operational amplifier in the $N^{th}$ stage of operational amplification unit is further connected to the second input terminal of the operational amplifier in the $k^{th}$ stage of operational amplification unit by using the fourth resistor and the phase inverter; and the third resistor in the $k^{th}$ stage of operational amplification unit, the fourth resistor in the $k^{th}$ stage of operational amplification unit, the phase inverter, the first output terminal of the operational amplifier in the $N^{th}$ stage of operational amplification unit, the first input terminal of the operational amplifier in the $k^{th}$ stage of operational amplification unit, and the second input terminal of the operational amplifier in the $k^{th}$ stage of operational amplification unit form the feedback channel. In this possible implementation, a feedback channel of a dual-input and single-output operational amplification circuit is implemented.

In a possible implementation, an equivalent impedance of the load circuit is less than or equal to 1K ohms.

DESCRIPTION OF EMBODIMENTS

The following describes technical solutions in embodiments of the present invention with reference to the accompanying drawings.

Figure 1:
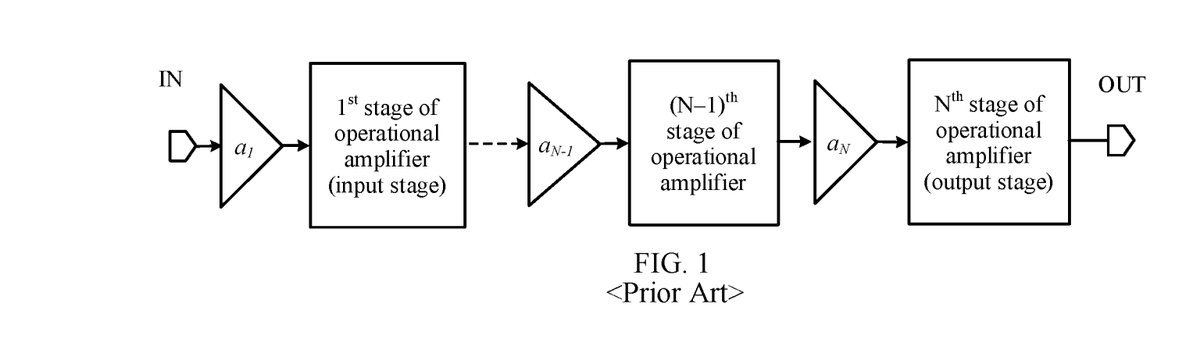
FIG. 1 is a structural diagram of an operational amplification circuit.

FIG. 1 is a structural diagram of an existing operational amplification circuit. As shown in FIG. 1, the operational amplification circuit uses a structure in which N stages of operational amplifiers are cascaded. The operational amplification circuit includes the $1^{st}$ stage of operational amplifier, ..., the $(N-1)^{th}$ stage of operational amplifier, and the $N^{th}$ stage of operational amplifier. An initial input signal may be input from an input (IN) terminal, the $1^{st}$ stage of operational amplifier is an input stage of the operational amplification circuit, the $N^{th}$ stage of operational amplifier is an output stage of the operational amplification circuit, and an output signal may be finally output from an output (OUT) terminal. A channel between the $1^{st}$ stage of operational amplifier, ..., the $(N-1)^{th}$ stage of operational amplifier, and the $N^{th}$ stage of operational amplifier may be considered as a feedforward channel from an output terminal of each stage to an input terminal a next stage. A coefficient of feedforward from an input terminal to the $1^{st}$ stage of operational amplifier is $a_1$, a coefficient of feedforward from the $1^{st}$ stage of operational amplifier to the $2^{nd}$ stage of operational amplifier is $a_2$, ..., and a coefficient of feedforward from the $(N-1)^{th}$ stage of operational amplifier to the $N^{th}$ stage of operational amplifier is $a_N$. The coefficient of feedforward is an amplification factor when a current-stage signal is transmitted to a next stage by using the feedforward channel.

Figure 2:
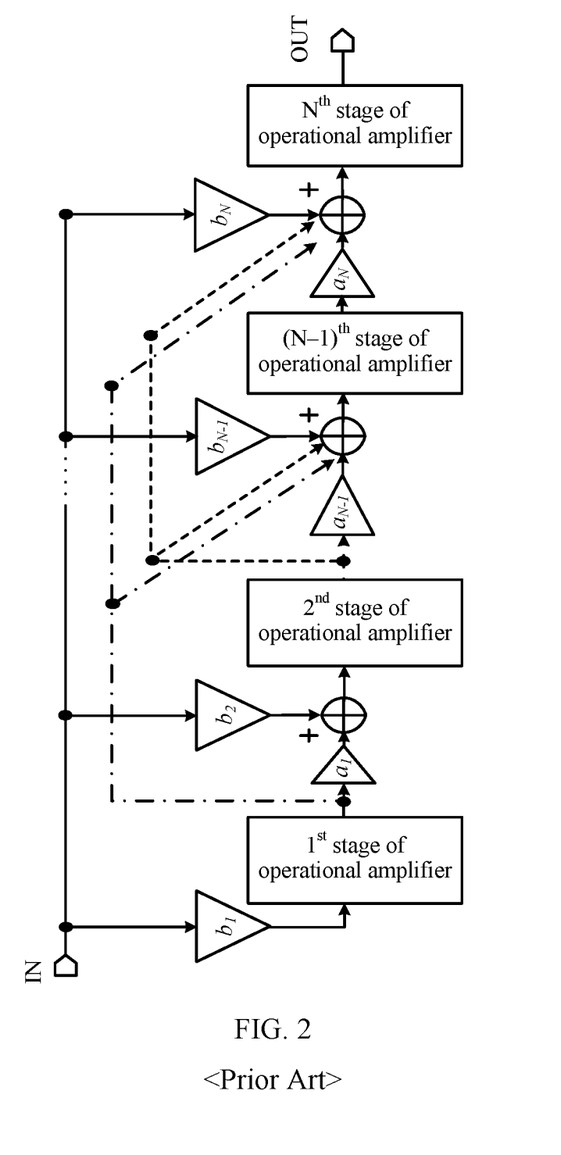
FIG. 2 is a structural diagram of another operational amplification circuit.

FIG. 2 is a structural diagram of an existing operational amplification circuit improved based on the operational amplification circuit in FIG. 1. Based on the operational amplification circuit shown in FIG. 1, a feedforward channel from an input terminal to an input terminal of each stage of operational amplifier is added to the operational amplification circuit shown in FIG. 2. A coefficient of feedforward from the input terminal to the $1^{st}$ stage of operational amplifier is $b_1$, a coefficient of feedforward from the input terminal to the $2^{nd}$ stage of operational amplifier is $b_2$, ..., and a coefficient of feedforward from the input terminal to the $(N-1)^{th}$ stage of operational amplifier is $b_{N-1}$, and a coefficient of feedforward from the input terminal to the $N^{th}$ stage of operational amplifier is $b_N$. It may be understood that $a_1=b_1$ herein. In some existing solutions, there may further be a feedforward channel from an input terminal of each stage of operational amplifier to an input terminal of each stage of operational amplifier following the stage. This is specifically shown by a dashed line in FIG. 2, and details are not described herein.

Figure 3:
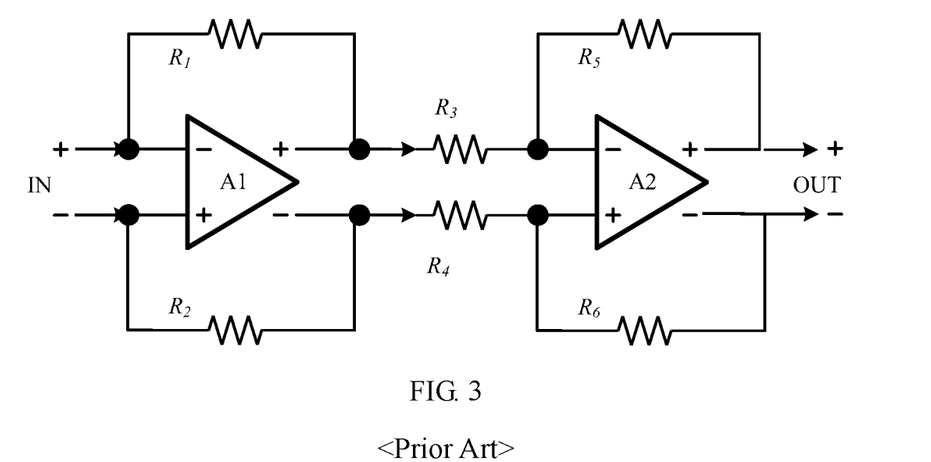
FIG. 3 is a structural diagram of another operational amplification circuit.

For example, N=2. FIG. 3 is a specific structural diagram of an existing operational amplification circuit. The operational amplification circuit shown in FIG. 3 is a dual-input and dual-output operational amplification circuit. In FIG. 3, input signals are connected to two input terminals of the $1^{st}$ stage of operational amplifier A1, a resistor $R_1$ is bridged between a group of output terminal and input terminal that are of the $1^{st}$ stage of operational amplifier A1, and a resistor $R_2$ is bridged between another group of output terminal and input terminal that are of the $1^{st}$ stage of operational amplifier A1, where the resistors $R_1$ and $R_2$ have an equal resistance value. Two output terminals of the $1^{st}$ stage of operational amplifier A1 are connected to two input terminals of the $2^{nd}$ stage of operational amplifier A2 respectively by using two resistors $R_3$ and $R_4$ that have an equal resistance value. A resistor $R_5$ is bridged between a group of output terminal and input terminal that are of the $2^{nd}$ stage of operational amplifier A2, and a resistor $R_6$ is bridged between another group of output terminal and input terminal that are of the $2^{nd}$ stage of operational amplifier A2, where the resistors $R_5$ and $R_6$ have an equal resistance value. There is no feedback channel from output signals to the input terminals of the $1^{st}$ stage of operational amplifier A1, and there is no feedback channel from the output signals to the input terminals of the $2^{nd}$ stage of operational amplifier A2, either.

Figure 4:
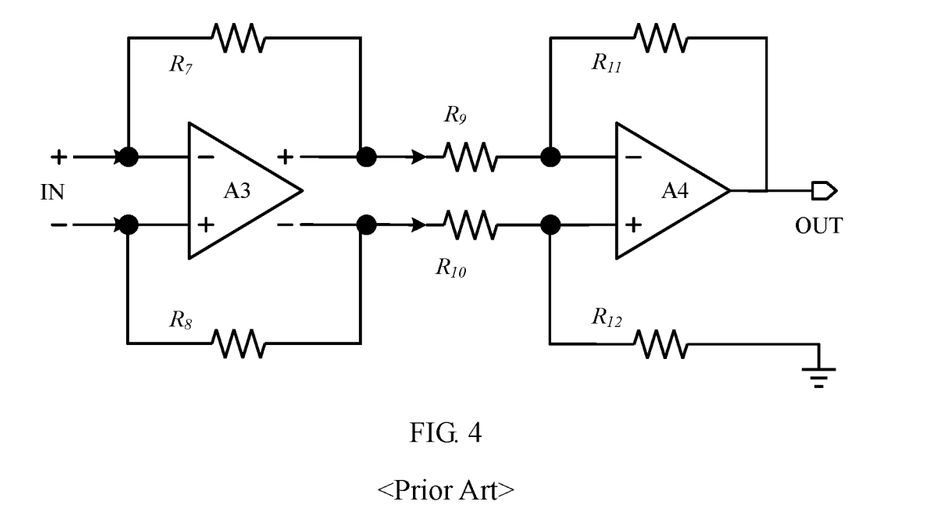
FIG. 4 is a structural diagram of another operational amplification circuit.

N=2 is still used as an example. FIG. 4 is a specific structural diagram of another existing operational amplification circuit. The operational amplification circuit shown in FIG. 4 is a dual-input and single-output operational amplification circuit. A structure of the operational amplification circuit shown in FIG. 4 is quite similar to the structure of the operational amplification circuit shown in FIG. 3. A difference is that the second stage shown in FIG. 3 has two output terminals, and the second stage shown in FIG. 4 has only one output terminal. In FIG. 4, input signals are connected to two input terminals of the $1^{st}$ stage of operational amplifier A3, a resistor $R_7$ is bridged between a group of output terminal and input terminal that are of the $1^{st}$ stage of operational amplifier A3, and a resistor $R_8$ is bridged between another group of output terminal and input terminal that are of the $1^{st}$ stage of operational amplifier A3, where the resistors $R_7$ and $R_8$ have an equal resistance value Two output terminals of the $1^{st}$ stage of operational amplifier A3 are connected to two input terminals of the $2^{nd}$ stage of operational amplifier A4 respectively by using two resistors $R_9$ and $R_{10}$ that have an equal resistance value. A resistor $R_{11}$ is bridged between an output terminal and an input terminal of the $2^{nd}$ stage of operational amplifier A4, and a resistor $R_{12}$ is bridged between the other input terminal of the $2^{nd}$ stage of operational amplifier A4 and ground. There is no feedback channel from output signals to the input terminals of the $1^{st}$ stage of operational amplifier A3, and there is no feedback channel from the output signals to the input terminals of the $2^{nd}$ stage of operational amplifier A4, either.

In the operational amplification circuits with a cascading structure shown in FIG. 1 to FIG. 4, non-ideal features of a signal increase stage by stage, and are accumulated at an output stage, and performance of the operational amplification circuit is severely affected.

Figure 5:
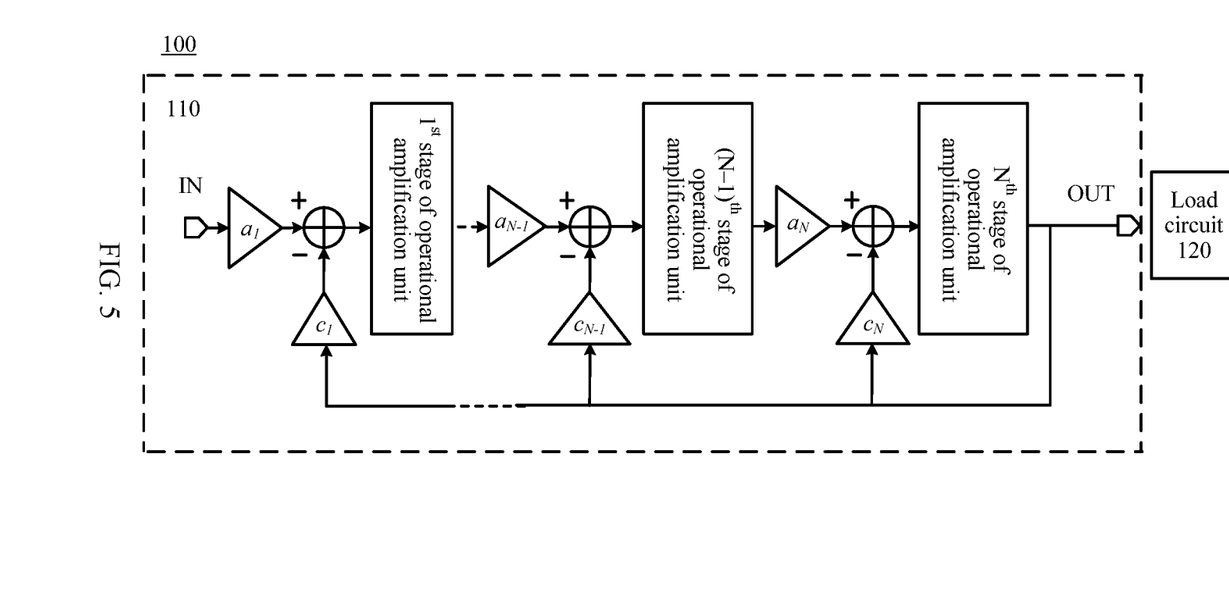
FIG. 5 is a structural diagram of a circuit system according to an embodiment of the present invention.

Based on the foregoing problems, an embodiment of the present invention provides a circuit system. FIG. 5 is a structural diagram of a circuit system 100 according to an embodiment of the present invention. As shown in FIG. 5, the circuit system 100 includes an operational amplification circuit 110. The operational amplification circuit 110 includes N stages of operational amplification units that are cascaded, and each stage of operational amplification unit includes an input terminal and an output terminal. The input terminal of the $1^{st}$ stage of operational amplification unit is an input terminal of the operational amplification circuit 110 and is configured to receive an initial input signal, and the output terminal of the $N^{th}$ stage of operational amplification unit is an output terminal of the operational amplification circuit 110, where N is greater than or equal to 2; the output terminal of the $i^{th}$ stage of operational amplification unit is connected to the input terminal of the $(i+1)^{th}$ stage of operational amplification unit, so as to provide an input signal for the $(i+1)^{th}$ stage of operational amplification unit, where i is 1, 2, ..., N-1; and there is a feedback channel from the output terminal of the $N^{th}$ stage of operational amplification unit to the input terminal of each of the $1^{st}$ stage of operational amplification unit to the $N^{th}$ stage of operational amplification unit, so as to transmit an output signal of the $N^{th}$ stage of operational amplification unit to the input terminal of each stage of operational amplification unit.

Optionally, as shown in FIG. 5, the circuit system 100 may further include a load circuit 120. The output terminal of the operational amplification circuit 110 is connected to the load circuit 120, so as to drive the load circuit 120. The operational amplification circuit 110 in the circuit system 100 in this embodiment of the present invention is particularly applicable to a case of driving a heavy load, for example, applicable to a case in which an equivalent impedance of the load circuit 120 is less than or equal to 1K ohms. This is because when an operational amplification circuit used for driving a load drives a heavy load, non-ideal features of the operational amplification circuit dramatically deteriorate. However, the feedback channel is added to the operational amplification circuit in the circuit system in this embodiment of the present invention. Therefore, a loop gain of the operational amplification circuit can be increased, and the non-ideal features of the operational amplification circuit can be suppressed, thereby improving performance of the operational amplification circuit.

It should be understood that the load circuit in this embodiment of the present invention is briefly referred to as a load, and is a circuit that is connected to two ends of a power supply (a power supply component) in a circuit, that works with electrical power, and that includes one or more electronic components.

It should be further understood that for the operational amplification circuit used for driving a load, a lower equivalent impedance of the load driven by the operational amplification circuit indicates a heavier load and higher output power of the operational amplification circuit. The equivalent impedance of the load circuit 120 in the circuit system 100 in this embodiment of the present invention may be less than or equal to 1K ohms. For example, the load circuit 120 may be an audio frequency circuit of a headphone or a earphone, or the load circuit 120 may be a circuit of a line driver. That is, the operational amplification circuit 110 in this embodiment of the present invention may be used for outputting high power, and is capable of driving a heavy load.

As shown in FIG. 5, the operational amplification circuit 110 includes the $1^{st}$ stage of operational amplification unit, ..., the $(N-1)^{th}$ stage of operational amplification unit, and the $N^{th}$ stage of operational amplification unit that are cascaded. The initial input signal may be input from the input (IN) terminal of the operational amplification circuit 110 (that is, the input terminal of the $1^{st}$ stage of operational amplification unit). The $N^{th}$ stage of operational amplification unit is an output stage of the operational amplification circuit 110, and the output signal may be finally output from the output (OUT) terminal of the operational amplification circuit 110 (that is, the output terminal of the $N^{th}$ stage of operational amplification unit). A channel between the $1^{st}$ stage of operational amplification unit, ..., the $(N-1)^{th}$ stage of operational amplification unit, and the $N^{th}$ stage of operational amplification unit may be considered as a feedforward channel from an output terminal of each stage to an input terminal of a next stage. A coefficient of feedforward from the input terminal of the operational amplification circuit 110 to the $1^{st}$ stage of operational amplification unit is $a_1$, a coefficient of feedforward from the $1^{st}$ stage of operational amplification unit to the $2^{nd}$ stage of operational amplification unit is $a_2$, ..., and a coefficient of feedforward from the $(N-1)^{th}$ stage of operational amplification unit to the $N^{th}$ stage of operational amplification unit is $a_N$.

There is a feedback channel from the output terminal of the $N^{th}$ stage of operational amplification unit (that is, the output terminal of the operational amplification circuit 110) to the input terminal of each of the $1^{st}$ stage of operational amplification unit to the $N^{th}$ stage of operational amplification unit. A coefficient of feedback from the output terminal of the operational amplification circuit 110 to the input terminal of the $1^{st}$ stage of operational amplification unit is $c_1$, a coefficient of feedback from the output terminal of the operational amplification circuit 110 to the input terminal of the $(N-1)^{th}$ stage of operational amplification unit is $c_{N-1}$, ..., and a coefficient of feedback from the output terminal of the operational amplification circuit 110 to the input terminal of the $N^{th}$ stage of operational amplification unit is $c_N$. The coefficient of feedback is an amplification factor when a current-stage signal is transmitted to a previous stage by using the feedback channel. The operational amplification circuit 110 transmits the output signal of the $N^{th}$ stage of operational amplification unit to the input terminal of each stage of operational amplification unit, and consequently, an output signal of the $i^{th}$ stage of operational amplification unit is affected, thereby affecting an output signal of the operational amplification circuit 110.

In the circuit system in this embodiment of the present invention, the feedback channel is added to the operational amplification circuit, so that a loop gain of the operational amplification circuit can be increased, and the non-ideal features of the operational amplification circuit can be suppressed when the operational amplification circuit drives the load circuit, thereby improving the performance of the operational amplification circuit.

In this embodiment of the present invention, optionally, there may be a feedback channel from the output terminal of any stage of operational amplification unit of N-1 stages of operational amplification units to the input terminal of each of all stages of operational amplification units preceding the stage. If the stage is the $j^{th}$ stage of operational amplification unit, there is a feedback channel from the output terminal of the $j^{th}$ stage of operational amplification unit to the input terminal of each of the $1^{st}$ stage of operational amplification unit to the $j^{th}$ stage of operational amplification unit, where j is any value from 1 to N-1.

Figure 6:
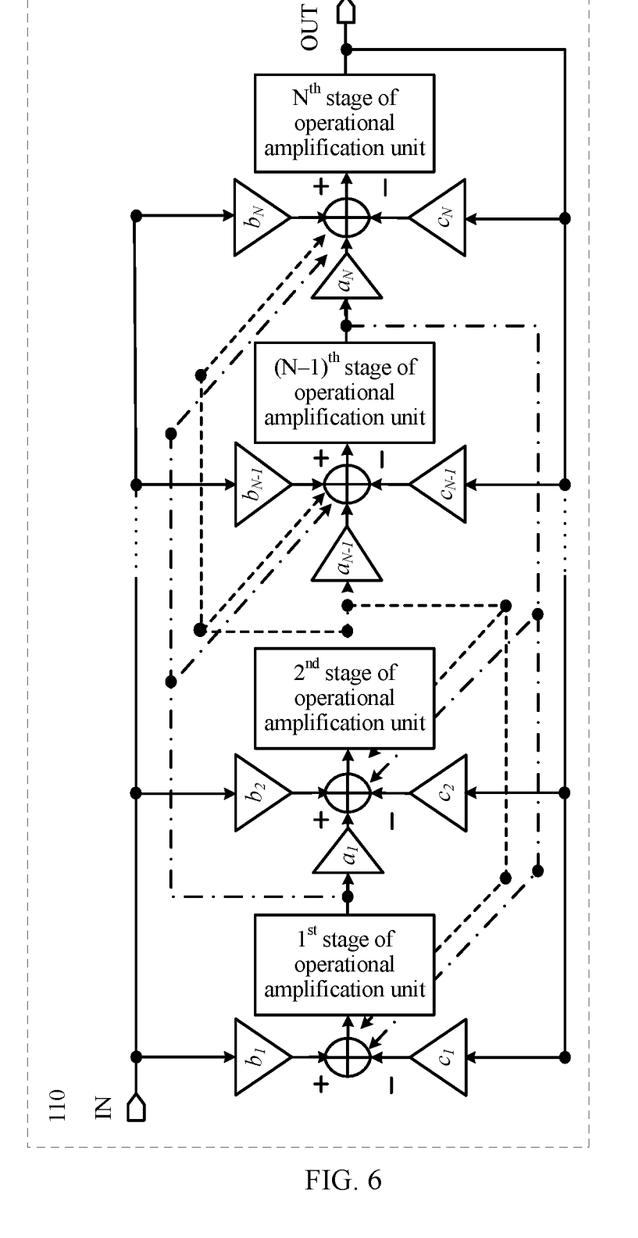
FIG. 6 is a structural diagram of a circuit system according to an embodiment of the present invention.

Specifically, as shown in FIG. 6, FIG. 6 is a structural diagram of an operational amplification circuit 110 in a circuit system 100 according to an embodiment of the present invention. In FIG. 6, a dashed line below a channel from the $1^{st}$ stage of operational amplification unit to the $N^{th}$ stage of operational amplification unit is a feedback channel from an output terminal of any stage of operational amplification unit of the $1^{st}$ stage of operational amplification unit to the $(N-1)^{th}$ stage of operational amplification unit to an input terminal of each of all stages of operational amplification units preceding the stage. It should be understood that there may be a feedback channel from each of N-1 stages of operational amplification units to a stage preceding the stage, or there may be feedback channels from only several stages to a stage preceding the several stages. This is not limited in this embodiment of the present invention.

In this embodiment of the present invention, optionally, as shown in FIG. 6, there may be a feedforward channel from an input terminal of the $1^{st}$ stage of operational amplification unit to an input terminal of each of N stages of operational amplification units. Specifically, a coefficient of feedforward from an input terminal of the operational amplification circuit 110 to the $1^{st}$ stage of operational amplifier is $b_1$, a coefficient of feedforward from the input terminal of the operational amplification circuit 110 to the $2^{nd}$ stage of operational amplifier is $b_2$, a coefficient of feedforward from the input terminal of the operational amplification circuit 110 to the $(N-1)^{th}$ stage of operational amplifier is $b_{N-1}$, and a coefficient of feedforward from the input terminal of the operational amplification circuit 110 to the $N^{th}$ stage of operational amplifier is $b_N$.

In this embodiment of the present invention, optionally, as shown in FIG. 6, there may be a feedforward channel from an output terminal of any stage of operational amplification unit of N−1 stages of operational amplification units to an input terminal of each of all stages of operational amplification units following the stage. If the stage is the $j^{th}$ stage of operational amplification unit, there is a feedforward channel from an output terminal of the $j^{th}$ stage of operational amplification unit to an input terminal of each stage of operational amplification unit following the $j^{th}$ stage of operational amplification unit, where j is any value from 1 to N−1.

Specifically, as shown in FIG. 6, a dashed line above the channel from the $1^{st}$ stage of operational amplification unit to the $N^{th}$ stage of operational amplification unit is a feedforward channel from an output terminal of any stage of operational amplification unit of the $1^{st}$ stage of operational amplification unit to the $(N−1)^{th}$ stage of operational amplification unit to an input terminal of each of all stages of operational amplification units following the stage. It should be understood that there may be a feedforward channel from each of N−1 stages of operational amplification units to a stage following the stage, or there may be feedforward channels from only several stages to a stage following the several stages. This is not limited in this embodiment of the present invention.

It should be understood that feedforward channels and feedback channels in all embodiments of the present invention may be implemented by using a passive channel such as a resistor or a capacitor, or implemented by using an active channel such as a transistor, an electron tube, an operational amplifier, or a phase inverter (the operational amplifier and the phase inverter may also be implemented by using the transistor and/or the electron tube), or implemented by using a combination of the passive channel and the active channel. That is, the feedforward channels and the feedback channels in all the embodiments of the present invention may each include at least one of a resistor, a capacitor, a transistor, or an electron tube. A specific example is given below.

It should be further understood that the operational amplification circuit 110 in the circuit system 100 in this embodiment of the present invention may be a dual-input and dual-output operational amplification circuit, or may be a dual-input and single-output operational amplification circuit. Several specific structures of the operational amplification circuit 110 are provided below by using N=2 as an example.

In a specific example, any stage of operational amplification unit in the operational amplification circuit, for example, the $k^{th}$ stage of operational amplification unit, may include an operational amplifier with a first input terminal, a second input terminal, a first output terminal, and a second output terminal, and a first capacitor and a second capacitor that have an equal capacity, and k is any value from 1 to N, where the first input terminal of the operational amplifier in the $k^{th}$ stage of operational amplification unit is connected to the first output terminal of the operational amplifier in the $k^{th}$ stage of operational amplification unit by using the first capacitor, and the second input terminal of the operational amplifier in the $k^{th}$ stage of operational amplification unit is connected to the second output terminal of the operational amplifier in the $k^{th}$ stage of operational amplification unit by using the second capacitor; a first input terminal and a second input terminal of an operational amplifier in the $1^{st}$ stage of operational amplification unit are configured to receive an initial input signal; and the $s^{th}$ stage of operational amplification unit further includes a first resistor and a second resistor that have an equal resistance value, a first input terminal of an operational amplifier in the $s^{th}$ stage of operational amplification unit is connected to a first output terminal of an operational amplifier in the $(s−1)^{th}$ stage of operational amplification unit by using the first resistor, a second input terminal of the operational amplifier in the $s^{th}$ stage of operational amplification unit is connected to a second output terminal of the operational amplifier in the $(s−1)^{th}$ stage of operational amplification unit by using the second resistor, and s is any value from 2 to N.

Therefore, all stages of operational amplification units are mutually cascaded, so that a channel that is in FIG. 5 or FIG. 6 and that is from the $1^{st}$ stage of operational amplification unit to the $N^{th}$ stage of operational amplification unit is formed, and the channel may be considered as a feedforward channel.

In a specific example, any stage of operational amplification unit in the operational amplification circuit, for example, the $k^{th}$ stage of operational amplification unit, may include the operational amplifier with the first input terminal, the second input terminal, the first output terminal, and the second output terminal, and a third resistor and a fourth resistor that have an equal resistance value, and k is any value from 1 to N, where a first output terminal of an operational amplifier in the $N^{th}$ stage of operational amplification unit is connected to the first input terminal of the operational amplifier in the $k^{th}$ stage of operational amplification unit by using the third resistor, and a second output terminal of the operational amplifier in the $N^{th}$ stage of operational amplification unit is connected to the second input terminal of the operational amplifier in the $k^{th}$ stage of operational amplification unit by using the fourth resistor; and the third resistor in the $k^{th}$ stage of operational amplification unit, the fourth resistor in the $k^{th}$ stage of operational amplification unit, the first output terminal of the operational amplifier in the $N^{th}$ stage of operational amplification unit, the first input terminal of the operational amplifier in the $k^{th}$ stage of operational amplification unit, the second output terminal of the operational amplifier in the $N^{th}$ stage of operational amplification unit, and the second input terminal of the operational amplifier in the $k^{th}$ stage of operational amplification unit form a feedback channel.

Therefore, a feedback channel that is in FIG. 5 or FIG. 6 and that is from the output terminal of the operational amplification circuit to the input terminal of each stage of operational amplification unit is formed.

Figure 7:
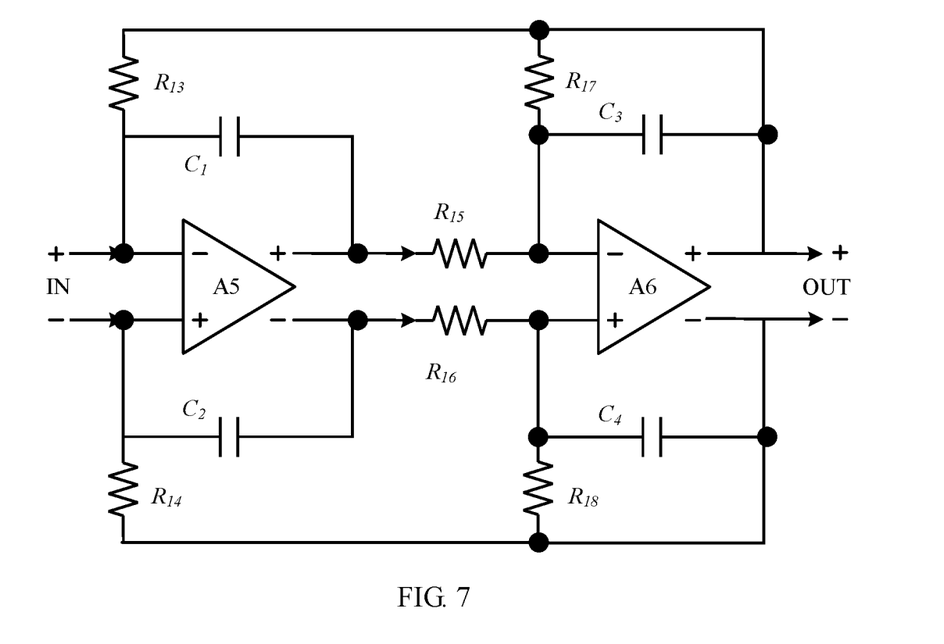
FIG. 7 is a structural diagram of an operational amplification circuit in a circuit system according to an embodiment of the present invention.

FIG. 7 is a structural diagram of an operational amplification circuit in a circuit system according to a specific embodiment of the present invention. The operational amplification circuit shown in FIG. 7 includes two stages of operational amplification units that are cascaded, and is a dual-input and dual-output operational amplification circuit. A signal output by the operational amplification circuit is a differential signal, and the differential signal may be used to drive a fully differential load circuit. In FIG. 7, the $1^{st}$ stage of operational amplification unit includes an operational amplifier A5, and a first capacitor $C_1$ and a second capacitor $C_2$ that have an equal capacity. Input signals are connected to two input terminals of the operational amplifier A5, the first capacitor $C_1$ is bridged between a group of input terminal and output terminal of the operational amplifier A5, and the second capacitor $C_2$ is bridged between another group of input terminal and output terminal of the operational amplifier A5. The $2^{nd}$ stage of operational amplification unit includes an operational amplifier A6, and a first capacitor $C_3$ and a second capacitor $C_4$ that have an equal capacity. The first capacitor $C_3$ is bridged between a group of input terminal and output terminal of the operational amplifier A6, and the second capacitor $C_4$ is bridged between another group of input terminal and output terminal of the operational amplifier A6. The $2^{nd}$ operational amplification unit further includes a first resistor $R_{15}$ and a second resistor $R_{16}$ that have an equal resistance value. The two output terminals of the operational amplifier A5 are connected to the two input terminals of the operational amplifier A6 respectively by using the first resistor $R_{15}$ and the second resistor $R_{16}$.

The $1^{st}$ stage of operational amplification unit further includes a third resistor $R_{13}$ and a fourth resistor $R_{14}$ that have an equal resistance value; and an output signal is fed back to one input terminal of the operational amplifier A5 by using the third resistor $R_{13}$, and is fed back to the other input terminal of the operational amplifier A5 by using the fourth resistor $R_{14}$. The $2^{nd}$ stage of operational amplification unit further includes a third resistor $R_{17}$ and a fourth resistor $R_{18}$ that have an equal resistance value; and an output signal is fed back to one input terminal of the operational amplifier A6 by using the third resistor $R_{17}$, and is fed back to the other input terminal of the operational amplifier A6 by using the fourth resistor $R_{18}$. The third resistor, the fourth resistor, and the two input terminals of either of the stages of operational amplification units (the $1^{st}$ stage of operational amplification unit or the $2^{nd}$ stage of operational amplification unit) and the two output terminals of the $2^{nd}$ stage of operational amplification unit form a feedback channel.

Performance of the operational amplification circuit shown in FIG. 7 in this embodiment of the present invention and performance of the existing operational amplification circuit shown in FIG. 3 are analyzed below in detail. The operational amplification circuits shown in FIG. 3 and FIG. 7 are both dual-input and dual-output operational amplification circuits, and therefore, may be compared in terms of performance.

Symbols are first described. $V_{OS5}$, $V_{OS6}$, $V_{OS1}$, and $V_{OS2}$ are respectively offset voltages of the operational amplifiers A5, A6, A1, and A2; $\overline{Vn_{A5}^2}$, $\overline{Vn_{A6}^2}$, $\overline{Vn_{A1}^2}$, and $\overline{Vn_{A2}^2}$ are respectively equivalent input noise powers of the operational amplifiers A5, A6, A1, and A2; and $\overline{Vn_{R13}^2}$, $\overline{Vn_{R15}^2}$, $\overline{Vn_{R17}^2}$, $\overline{Vn_{R1}^2}$, $\overline{Vn_{R3}^2}$, and $\overline{Vn_{R5}^2}$ are respectively thermal noise powers of the resistor $R_{13}$ (and the resistor $R_{14}$), $R_{15}$ (and the resistor $R_{16}$), $R_{17}$ (and the resistor $R_{18}$), $R_1$ (and the resistor $R_2$), $R_3$ (and the resistor $R_4$), and $R_5$ (and the resistor $R_6$). $\overline{Vn_{in}^2}$ and $\overline{Vn_{out}^2}$ are respectively an input equivalent noise power and an output equivalent noise power. $A5_1$, $A5_2$, $A5_3$ are respectively amplification factors used by the operational amplifier A5 to perform amplification on a monomial term, a quadratic term, and a cubic term of the input signal; $A6_1$, $A6_2$, and $A6_3$ are respectively amplification factors used by the operational amplifier A6 to perform amplification on the monomial term, the quadratic term, and the cubic term of the input signal; $A1_1$, $A1_2$, and $A1_3$ are respectively amplification factors used by the operational amplifier A1 to perform amplification on the monomial term, the quadratic term, and the cubic term of the input signal; and $A2_1$, $A2_2$, and $A2_3$ are respectively amplification factors used by the operational amplifier A2 to perform amplification on the monomial term, the quadratic term, and the cubic term of the input signal. An input equivalent resistance of the operational amplification circuit in FIG. 7 is denoted as $R_{in}$; $c_1$, $c_2$, and $c_3$ are respectively amplification factors used by a circuit including the operational amplifier A5, capacitors $C_1$ and $C_2$, and the resistors $R_{13}$ and $R_{14}$ to perform amplification on the monomial term, the quadratic term, and the cubic term of the input signal; $d_1$, $d_2$, and $d_3$ are respectively amplification factors used by a circuit including the operational amplifier A6, capacitors $C_3$ and $C_4$, and the resistors $R_{17}$ and $R_{18}$ to perform amplification on the monomial term, the quadratic term, and the cubic term of the input signal; and $T=1+c_1 \cdot A6_1$ is a loop gain.

Non-ideal features such as an offset, a noise, and a harmonic distortion of the two types of operational amplification circuits in FIG. 7 and FIG. 3 are obtained by means of inference. For details, refer to Table 1. $HD_2$ is a second-order distortion, and $HD_3$ is a third-order distortion. According to a result shown in Table 1, if corresponding components in the two types of operational amplification circuits shown in FIG. 7 and FIG. 3 are totally the same, that is, the operational amplifiers A5 and A6 are respectively the same as the operational amplifiers A1 and A2, and the resistors $R_{13}$, $R_{14}$, $R_{15}$, $R_{16}$, $R_{17}$, and $R_{18}$ are respectively the same as $R_1$, $R_2$, $R_3$, $R_4$, $R_5$, and $R_6$, an offset of the operational amplification circuit shown in FIG. 7 is less than that of the operational amplification circuit in the existing solution shown in FIG. 3. First-order shaping is performed on noises of the resistor $R_{15}$, the resistor $R_{16}$, the resistor $R_{17}$, the resistor $R_{18}$, and the operational amplifier A6. Therefore, a noise of the operational amplification circuit shown in FIG. 7 is also less than that of the operational amplification circuit in the existing solution shown in FIG. 3. The loop gain $T=1+c_1 \cdot A6_1$ is relatively high, so that a distortion of the operational amplification circuit shown in FIG. 7 is attenuated due to the loop gain, and is further attenuated due to lower signal amplitude caused by the loop gain. Therefore, a harmonic distortion and a noise of the operational amplification circuit shown in FIG. 7 are also less than those of the operational amplification circuit in the existing solution shown in FIG. 3. In conclusion, the non-ideal features of the operational amplification circuit shown in FIG. 7 are better than those of the operational amplification circuit in the existing solution shown in FIG. 3.

TABLE 1

A comparison between non-ideal features of the operational amplification circuits shown in FIG. 7 and FIG. 3

| | Operational amplification circuit in FIG. 7 | Operational amplification circuit in FIG. 3 |
|---|---|---|
| Offset | $V_{OS5} + \dfrac{1}{A5_1} V_{OS6}$ | $\dfrac{R_5}{R_3} V_{OS1} + V_{OS2}\left(1 + \dfrac{R_5}{R_3}\right)$ |
| Noise | $Vn_{in}\|_{R13} = \dfrac{R_{in}}{R_{13}} Vn_{R13},\ Vn_{in}\|_{R15} = sR_{in}C_1 Vn_{R15}$ $Vn_{in}\|_{R17} = \dfrac{R_{17}}{R_{15}} sR_{in}C_1 Vn_{R17},\ Vn_{in}\|_{A5} = (1 + sR_{in}C_1) Vn_{A5}$ $Vn_{in}\|_{A6} = sR_{in}C_1 \dfrac{R_{15} + R_{17} + sR_{15}R_{17}C_3}{R_{17} + sR_{15}R_{17}C_3} Vn_{A6}$ | $\overline{Vn_{out}^2} = 2\overline{Vn_{R5}^2} + \left(2\overline{Vn_{R1}^2} + \overline{Vn_3^2} + 2\overline{Vn_{R3}^2}\right)\left(\dfrac{R_5}{R_3}\right)^2 + \overline{Vn_4^2}\left(1 + \dfrac{R_5}{R_3}\right)^2$ |

TABLE 1-continued

A comparison between non-ideal features of the operational amplification circuits shown in FIG. 7 and FIG. 3

| | Operational amplification circuit in FIG. 7 | Operational amplification circuit in FIG. 3 |
|---|---|---|
| Distortion | $HD_2 = \frac{1}{2}\left(\frac{A5_2}{A5_1} + \frac{c_1 R_{17}}{R_{15}(1+sR_{17}C_3)}\frac{A6_2}{A6_1}\frac{1}{1+A5_1}\right)\frac{1}{T}\frac{I_{in}R_{13}}{T}$ | $HD_2 = \frac{1}{2}\left(\frac{A1_2}{A1_1} + A1_1\frac{R_5}{R_3}\frac{A2_2}{A2_1}\right)I_{in}$ |
| | $HD_3 = \frac{1}{4}\left[\frac{A5_3}{A5_1}\frac{1}{T} - \left(\frac{A5_2}{A5_1}\right)^2\frac{2A6_1 c_1}{T^2}\right]\left(\frac{I_{in}R_{13}}{T}\right)^2 +$ | $HD_3 = \frac{1}{4}\left[\frac{A1_3}{A1_1} + 2A1_2\frac{R_5}{R_3}\frac{A2_2}{A2_1} + A1_1^2\left(\frac{R_5}{R_3}\right)^2\frac{A1_3}{A1_1}\right]\cdot I_{in}^2$ |
| | $\frac{1}{4}\left[A5_1^2\frac{d_3}{d_1}\frac{1}{T} - \left(\frac{d_2}{d_1}\right)^2\frac{2d_1 A5_1^3}{T^2}\right]\left(\frac{I_{in}R_{13}}{T}\right)^2$ | |

In another specific example, any stage of operational amplification unit in the operational amplification circuit, for example, the $k^{th}$ stage of operational amplification unit, may include an operational amplifier with a first input terminal, a second input terminal, and a first output terminal, and a first capacitor and a second capacitor that have an equal capacity, and k is any value from 1 to N; and an operational amplifier in the $j^{th}$ stage of operational amplification unit further includes a second output terminal, and j is any value from 1 to N−1, where a first input terminal of the operational amplifier in the $j^{th}$ stage of operational amplification unit is connected to a first output terminal of operational amplifier in the $j^{th}$ stage of operational amplification unit by using the first capacitor, and a second input terminal of the operational amplifier in the $j^{th}$ stage of operational amplification unit is connected to the second output terminal of operational amplifier in the $j^{th}$ stage of operational amplification unit by using the second capacitor; the $N^{th}$ stage of operational amplification unit further includes a phase inverter, the phase inverter is connected in series to the second capacitor, a first input terminal of an operational amplifier in the $N^{th}$ stage of operational amplification unit is connected to a first output terminal of the operational amplifier in the $N^{th}$ stage of operational amplification unit by using the first capacitor, and a second input terminal of operational amplifier in the $N^{th}$ stage of operational amplification unit is connected to the first output terminal of the operational amplifier in $N^{th}$ stage of operational amplification unit by using the phase inverter and the second capacitor that are connected in series; a first input terminal and a second input terminal of an operational amplifier in the $1^{st}$ stage of operational amplification unit are configured to receive an initial input signal; and the $s^{th}$ stage of operational amplification unit further includes a first resistor and a second resistor that have an equal resistance value, a first input terminal of an operational amplifier in the $s^{th}$ stage of operational amplification unit is connected to a first output terminal of an operational amplifier in the $(s-1)^{th}$ stage of operational amplification unit by using the first resistor, a second input terminal of the operational amplifier in the $s^{th}$ stage of operational amplification unit is connected to a second output terminal of the operational amplifier in the $(s-1)^{th}$ stage of operational amplification unit by using the second resistor, and s is any value from 2 to N.

Therefore, all stages of operational amplification units are mutually cascaded, so that a channel that is in FIG. 5 or FIG. 6 and that is from the $1^{st}$ stage of operational amplification unit to the $N^{th}$ stage of operational amplification unit is formed, and the channel may be considered as a feedforward channel.

In a specific example, any stage of operational amplification unit in the operational amplification circuit, for example, the $k^{th}$ stage of operational amplification unit, may include the operational amplifier with the first input terminal, the second input terminal, and the first output terminal, and a third resistor and a fourth resistor that have an equal resistance value, and k is any value from 1 to N; and the operational amplifier in the $j^{th}$ stage of operational amplification unit further includes the second output terminal, and j is any value from 1 to N−1, where the $N^{th}$ stage of operational amplification unit further includes the phase inverter, the first output terminal of the operational amplifier in the $N^{th}$ stage of operational amplification unit is connected to the first input terminal of the operational amplifier in the $k^{th}$ stage of operational amplification unit by using the third resistor, and the first output terminal of the operational amplifier in the $N^{th}$ stage of operational amplification unit is further connected to the second input terminal of the operational amplifier in the $k^{th}$ stage of operational amplification unit by using the fourth resistor and the phase inverter; and the third resistor in the $k^{th}$ stage of operational amplification unit, the fourth resistor in the $k^{th}$ stage of operational amplification unit, the phase inverter, the first output terminal of the operational amplifier in the $N^{th}$ stage of operational amplification unit, the first input terminal of the operational amplifier in the $k^{th}$ stage of operational amplification unit, and the second input terminal of the operational amplifier in the $k^{th}$ stage of operational amplification unit form a feedback channel.

Therefore, a feedback channel that is in FIG. 5 or FIG. 6 and that is from the output terminal of the operational amplification circuit to the input terminal of each stage of operational amplification unit is formed.

Figure 8:
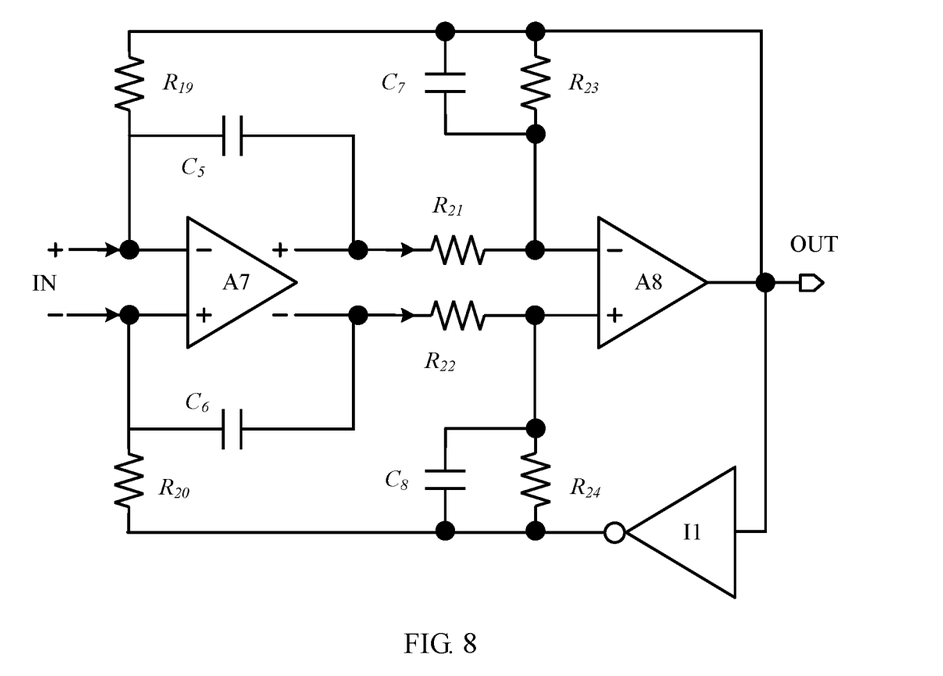
FIG. 8 is a structural diagram of an operational amplification circuit in a circuit system according to another embodiment of the present invention.

FIG. 8 is a structural diagram of an operational amplification circuit in a circuit system according to another specific embodiment of the present invention. The operational amplification circuit shown in FIG. 8 includes two stages of operational amplification units that are cascaded, and is a dual-input and single-output operational amplification circuit. An operational amplifier A8 and a phase inverter I1 form a pseudo-differential structure, so as to drive a single-terminal load circuit. In FIG. 8, the $1^{st}$ stage of operational amplification unit includes an operational amplifier A7, and a first capacitor $C_5$ and a second capacitor $C_6$ that have an equal capacity. Input signals are connected to two input terminals of the operational amplifier A7, the first capacitor $C_5$ is bridged between a group of input terminal and output terminal of the operational amplifier A7, and the second capacitor $C_6$ is bridged between another group of input terminal and output terminal of the operational amplifier A7. The $2^{nd}$ stage of operational amplification unit includes an operational amplifier A8, and a first capacitor $C_7$ and a second capacitor $C_8$ that have an equal capacity. The first capacitor $C_7$ is bridged between an input terminal and an output terminal of the operational amplifier A8, and the second capacitor $C_8$ is bridged between the output terminal and the other input terminal of the operational amplifier A8. The $2^{nd}$ operational amplification unit further includes a first resistor $R_{21}$ and a second resistor $R_{22}$ that have an equal resistance value. The two output terminals of the operational amplifier A7 are connected to the two input terminals of the operational amplifier A8 respectively by using the first resistor $R_{21}$ and the second resistor $R_{22}$.

The output terminal of the operational amplification circuit is further provided with the phase inverter I1, that is, the $2^{nd}$ stage of operational amplification unit further includes the phase inverter I1. The $1^{st}$ stage of operational amplification unit further includes a third resistor $R_{19}$ and a fourth resistor $R_{20}$ that have an equal resistance value. An output signal is fed back to an input terminal (an inverting input terminal) of the operational amplifier A7 by using the third resistor $R_{19}$; and the output signal passes through the phase inverter I1, so that an inverting output signal is generated, and the inverting output signal is fed back to the other input terminal (non-inverting input terminal) of the operational amplifier A7 by using the fourth resistor $R_{20}$. The $2^{nd}$ stage of operational amplification unit further includes a third resistor $R_{23}$ and a fourth resistor $R_{24}$ that have an equal resistance value. The output signal is fed back to an input terminal (an inverting input terminal) of the operational amplifier A8 by using the third resistor $R_{23}$; and the output signal passes through the phase inverter I1, so that an inverting output signal is generated, and the inverting output signal is fed back to the other input terminal (non-inverting input terminal) of the operational amplifier A8 by using the fourth resistor $R_{24}$. The third resistor, the fourth resistor, and the two input terminals of either of the stages of operational amplification units (the $1^{st}$ stage of operational amplification unit or the $2^{nd}$ stage of operational amplification unit) and the output terminal of the $2^{nd}$ stage of operational amplification unit form a feedback channel.

A result of comparing non-ideal features of the two types of operational amplification circuits in FIG. 8 and FIG. 4 is similar to that in Table 1. An offset of each operational amplifier in the operational amplification circuit in FIG. 8 is reduced before being output. First-order shaping is performed on noises of the resistor $R_{19}$, the resistor $R_{20}$, the resistor $R_{21}$, the resistor $R_{22}$, the resistor $R_{23}$, the resistor $R_{24}$, the operational amplifier A8, and the phase inverter I1 in the operational amplification circuit in FIG. 8, so that an overall noise is less than a noise of the operational amplification circuit in FIG. 4. A distortion of the operational amplifier A8 is attenuated due to gains of the operational amplifier A8, the phase inverter I1, and the operational amplifier A7. A distortion of the phase inverter I1 is attenuated due to gains of the phase inverter I1 and the operational amplifier A7. A distortion of the operational amplifier A7 is attenuated only due to a gain of the operational amplifier A7. Therefore, the non-ideal features of the operational amplification circuit shown in FIG. 8 are better than those of the operational amplification circuit in the existing solution shown in FIG. 4.

Figure 9:
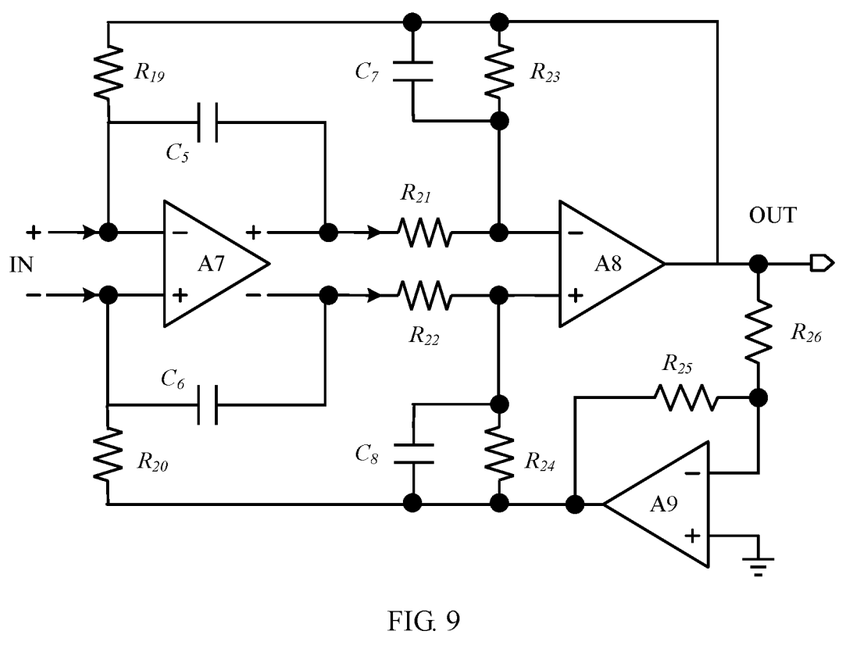
FIG. 9 is a structural diagram of an operational amplification circuit in a circuit system according to still another embodiment of the present invention.

The phase inverter I1 in FIG. 8 may be replaced with another component, so as to implement an inverting function. For example, the phase inverter may be implemented by using a combination of an operational amplifier A9, a resistor $R_{25}$, and a resistor $R_{26}$ shown in FIG. 9. Each component in each embodiment of the present invention may also be replaced with another component or a combination of components. This is not limited in the embodiments of the present invention.

It should be understood that "one embodiment" or "an embodiment" mentioned in the whole specification does not mean that particular features, structures, or characteristics related to the embodiment are included in at least one embodiment of the present invention. Therefore, "in one embodiment" or "in an embodiment" appearing throughout the specification does not necessarily refer to a same embodiment. In addition, these particular features, structures, or characteristics may be combined in one or more embodiments in any appropriate manner.

It should be understood that in the embodiments of the present invention, "B corresponding to A" indicates that B is associated with A, and B may be determined according to A. However, it should further be understood that determining A according to B does not mean that B is determined only according to A; that is, B may be determined according to A and/or other information.

It should be understood that, the term "and/or" in this specification describes only an association relationship for describing associated objects and represents that three relationships may exist. For example, A and/or B may represent the following three cases: Only A exists, both A and B exist, and only B exists. In addition, the character "/" in this specification generally indicates an "or" relationship between the associated objects.

A person of ordinary skill in the art may be aware that units and algorithm steps in examples that are described with reference to the embodiments disclosed in this specification may be implemented by electronic hardware or a combination of computer software and electronic hardware. Whether the functions are performed by hardware or software depends on particular applications and design constraint conditions of the technical solutions. A person skilled in the art may use different methods to implement the described functions for each particular application, but it should not be considered that the implementation goes beyond the scope of this application.

A person skilled in the art may clearly understand that, for the purpose of convenient and brief description, for detailed working processes of the foregoing system, apparatus, and unit, refer to corresponding processes in the foregoing method embodiments, and details are not described herein again.

In the several embodiments provided in this application, it should be understood that the disclosed system, apparatus, and method may be implemented in other manners. For example, the described apparatus embodiment is merely an example. For example, the unit division is merely logical function division and may be other division during actual implementation. For example, a plurality of units or components may be combined or integrated into another system, or some features may be ignored or not performed. In addition, the displayed or discussed mutual couplings or direct couplings or communication connections may be implemented by using some interfaces. The indirect couplings or communication connections between the apparatuses or units may be implemented in electronic, mechanical, or other forms.

The units described as separate parts may or may not be physically separate, and parts displayed as units may or may not be physical units, may be located in one position, or may be distributed on a plurality of network units. Some or all of the units may be selected according to actual requirements to achieve the objectives of the solutions of the embodiments.

The foregoing descriptions are merely specific implementations of this application, but are not intended to limit the protection scope of this application. Any variation or replacement readily figured out by a person skilled in the art within the technical scope disclosed in this application shall fall within the protection scope of this application. Therefore, the protection scope of this application shall be subject to the protection scope of the claims.

What is claimed is:

1. A circuit system, comprising an operational amplification circuit, wherein
the operational amplification circuit comprises:
N stages of operational amplification units that are cascaded, N being greater than or equal to 2, wherein each of the N stages comprises an input terminal and an output terminal and the N stages include a $1^{st}$ stage, an $N^{th}$ stage, and an $i^{th}$ stage, wherein
an input terminal of the $1^{st}$ stage is an input terminal of the operational amplification circuit and is configured to receive an initial input signal,
an output terminal of the $N^{th}$ stage is an output terminal of the operational amplification circuit, and
the output terminal of the $i^{th}$ stage is connected to the input terminal of the $(i+1)^{th}$ stage, so as to provide an input signal for the $(i+1)^{th}$ stage, wherein i is 1, 2, . . . , or N−1; and
a feedback channel from the output terminal of the $N^{th}$ stage to the input terminal of each of the N stages of operational amplification units exists, wherein the feedback channel is configured to facilitate a transmission of an output signal of the $N^{th}$ stage of operational amplification unit to the input terminal of each of the N stages; and, wherein
the operational amplification circuit is a dual-input and single-output operational amplification circuit for receiving a differential signal and driving a single-terminal load circuit;
the $N^{th}$ stage comprises an operational amplifier, and
the $N^{th}$ stage further comprises a phase inverter disposed on the feedback channel, the phase inverter and the operational amplifier in the $N^{th}$ stage of operational amplification unit constituting a pseudo-differential structure.

2. The circuit system according to claim 1, wherein the circuit system further comprises a load circuit; and, wherein the output terminal of the operational amplification circuit is connected to the load circuit, so as to drive the load circuit.

3. The circuit system according to claim 1, wherein the operational amplification circuit comprises a feedback channel from the output terminal of the $j^{th}$ stage to the input terminal of each of the $1^{st}$ to $j^{th}$ stages, j being a value between 1 and N−1.

4. The circuit system according to claim 3, wherein the operational amplification circuit comprises a feedforward channel from the input terminal of the $1^{st}$ stage to the input terminal of each of the N stages.

5. The circuit system according to claim 4, wherein the operational amplification circuit comprises a feedforward channel from the output terminal of the $j^{th}$ stage to the input terminal of each of $j+1^{th}$ to $N^{th}$ stages of the operational amplification units, j being a value between 1 and N−1.

6. The circuit system according to claim 5, wherein the feedforward channel and the feedback channel each comprises at least one of a resistor, a capacitor, a transistor, or an electron tube.

7. The circuit system according to claim 1, wherein a $k^{th}$ stage of operational amplification unit comprises an operational amplifier with a first input terminal, a second input terminal, a first output terminal, and a second output terminal, and a first capacitor and a second capacitor that have an equal capacity, k being a value between 1 an N; and, wherein
a first input terminal of an operational amplifier in the $k^{th}$ stage is connected to the first output terminal of the operational amplifier in the $k^{th}$ stage through the first capacitor, and the second input terminal of the operational amplifier in the $k^{th}$ stage is connected to the second output terminal of the operational amplifier in the $k^{th}$ stage through the second capacitor;
a first input terminal and a second input terminal of an operational amplifier in the $1^{st}$ stage are configured to receive the initial input signal; and
a $s^{th}$ stage comprises a first resistor and a second resistor that have an equal resistance value, wherein a first input terminal of an operational amplifier in the $s^{th}$ stage is connected to a first output terminal of an operational amplifier in the $(s-1)^{th}$ stage through the first resistor, a second input terminal of the operational amplifier in the $s^{th}$ stage is connected to a second output terminal of the operational amplifier in the $(s-1)^{th}$ stage through the second resistor, s being a value between 2 and N.

8. The circuit system according to claim 1, wherein a $k^{th}$ stage comprises the operational amplifier having the first input terminal, the second input terminal, the first output terminal, and the second output terminal, and a third resistor and a fourth resistor that have an equal resistance value, k i being a value between 1 and N; and, wherein
a first output terminal of an operational amplifier in the $N^{th}$ stage is connected to the first input terminal of the operational amplifier in the $k^{th}$ stage of operational amplification unit through the third resistor, and a second output terminal of the operational amplifier in the $N^{th}$ stage is connected to the second input terminal of the operational amplifier in the $k^{th}$ stage of operational amplification unit through the fourth resistor; and
the third resistor in the $k^{th}$ stage, the fourth resistor in the $k^{th}$ stage, the first output terminal of the operational amplifier in the $N^{th}$ stage, the first input terminal of the operational amplifier in the $k^{th}$ stage, the second output terminal of the operational amplifier in the $N^{th}$ stage of operational amplification unit, and the second input terminal of the operational amplifier in the $k^{th}$ stage constitute the feedback channel.

9. The circuit system according to claim 1, wherein a $k^{th}$ stage comprises an operational amplifier having a first input terminal, a second input terminal, and a first output terminal, and a first capacitor and a second capacitor that have an equal capacity, k being a value between 1 and N, and wherein an operational amplifier in the $j^{th}$ stage further comprises a second output terminal, j being a value between 1 and N−1, wherein
a first input terminal of the operational amplifier in the $j^{th}$ stage is connected to a first output terminal of operational amplifier in the $j^{th}$ stage through the first capacitor, and a second input terminal of the operational amplifier in the $j^{th}$ stage is connected to the second output terminal of operational amplifier in the $j^{th}$ stage through the second capacitor;

the phase inverter in the $N^{th}$ stage is connected in series to the second capacitor, wherein a first input terminal of an operational amplifier in the $N^{th}$ stage is connected to a first output terminal of the operational amplifier in the $N^{th}$ stage through the first capacitor, and a second input terminal of operational amplifier in the $N^{th}$ stage is connected to the first output terminal of the operational amplifier in $N^{th}$ stage through the phase inverter and the second capacitor that are connected in series;

a first input terminal and a second input terminal of an operational amplifier in the $1^{st}$ stage are configured to receive the initial input signal; and a $s^{th}$ stage comprises a first resistor and a second resistor that have an equal resistance value, wherein a first input terminal of an operational amplifier in the $s^{th}$ stage is connected to a first output terminal of an operational amplifier in the $(s-1)^{th}$ stage through the first resistor, a second input terminal of the operational amplifier in the $s^{th}$ stage is connected to a second output terminal of the operational amplifier in the $(s-1)^{th}$ stage through the second resistor, and s is any value from 2 to N.

10. The circuit system according to claim 1, wherein a $k^{th}$ stage comprises the operational amplifier having the first input terminal, the second input terminal, and the first output terminal, and a third resistor and a fourth resistor that have an equal resistance value, k being a value between 1 and N, and wherein the operational amplifier in the $j^{th}$ stage further comprises the second output terminal, j being a value between 1 and N-1; and, wherein the $N^{th}$ stage of operational amplification unit further comprises the phase inverter, the first output terminal of the operational amplifier in the $N^{th}$ stage of is connected to the first input terminal of the operational amplifier in the $k^{th}$ stage through the third resistor, and the first output terminal of the operational amplifier in the $N^{th}$ stage is further connected to the second input terminal of the operational amplifier in the $k^{th}$ stage through the fourth resistor and the phase inverter; and the third resistor in the $k^{th}$ stage, the fourth resistor in the $k^{th}$ stage, the phase inverter, the first output terminal of the operational amplifier in the $N^{th}$ stage, the first input terminal of the operational amplifier in the $k^{th}$ stage, and the second input terminal of the operational amplifier in the $k^{th}$ stage constitute the feedback channel.

11. The circuit system according to claim 2, wherein an equivalent impedance of the load circuit is less than or equal to 1K ohms.

\* \* \* \* \*